United States Patent
Eschauzier et al.

(10) Patent No.: US 7,812,665 B2
(45) Date of Patent: Oct. 12, 2010

(54) AMPLIFIERS WITH INPUT OFFSET TRIM AND METHODS

(75) Inventors: Rudy G. H. Eschauzier, Bergschenhoek (NL); Nico van Rijn, Katwijk (NL)

(73) Assignee: Number 14 B.V., Bergschenhoek (NL)

( * ) Notice: Subject to any disclaimer, the term of this patent is extended or adjusted under 35 U.S.C. 154(b) by 29 days.

(21) Appl. No.: 12/390,684

(22) Filed: Feb. 23, 2009

(65) Prior Publication Data
US 2010/0213983 A1    Aug. 26, 2010

(51) Int. Cl.
*H03F 1/02* (2006.01)
(52) U.S. Cl. .......................... 330/9; 327/124
(58) Field of Classification Search .............. 330/9; 327/124, 307
See application file for complete search history.

(56) References Cited

U.S. PATENT DOCUMENTS

| | | | |
|---|---|---|---|
| 4,764,753 A * | 8/1988 | Yukawa | 341/166 |
| 5,627,475 A * | 5/1997 | Strosser | 324/546 |
| 6,130,632 A | 10/2000 | Opris | |
| 6,348,885 B1 | 2/2002 | Munoz et al. | |
| 6,456,220 B1 * | 9/2002 | Leung et al. | 341/155 |
| 6,486,806 B1 | 11/2002 | Munoz et al. | |
| 6,707,403 B1 | 3/2004 | Hurrell | |
| 6,828,927 B1 | 12/2004 | Hurrell et al. | |
| 7,026,866 B2 | 4/2006 | Llewellyn | |
| 7,038,609 B1 | 5/2006 | Hurrell | |
| 2003/0214351 A1 | 11/2003 | Nandy et al. | |

FOREIGN PATENT DOCUMENTS

| | | |
|---|---|---|
| JP | 2-288616 | 11/1990 |
| WO | WO-2004/073163 | 8/2004 |

OTHER PUBLICATIONS

Enz, Christian C., et al., "Circuit Techniques for Reducing the Effects of Op-Amp Imperfections: Autozeroing, Correlated Double Sampling, and Chopper Stabilization", *Proceedings of the IEEE*, vol. 84, No. 11, (Nov. 1996), pp. 1584-1614.

(Continued)

*Primary Examiner*—Henry K Choe
(74) *Attorney, Agent, or Firm*—Blakely Sokoloff Taylor & Zafman LLP

(57) ABSTRACT

Amplifiers with power-on trim and methods using an amplifier system having an amplifier system input and an amplifier system output, an amplifier, a comparator, a successive approximation register having an input coupled to an output of the comparator, a first switch for switching an input of the amplifier from the amplifier system input to shorting the amplifier input, a second switch for switching an output of the amplifier from the amplifier system output to an input of the comparator, an output of the successive approximation register being coupled to an N bit digital to analog (D/A) converter, the D/A converter being a non-binary converter using a radix of less than 2 for at least the most significant bits, and an output of the D/A converter being coupled to the amplifier to control the input offset of the amplifier. Novel embodiments for the amplifier, comparator and D/A converter are disclosed.

12 Claims, 10 Drawing Sheets

OTHER PUBLICATIONS

Huijsing, J, "Operational Amplifiers, Theory and Design", Kluwer Academic Publishers, (2001), pp. 52-53.

Krummenacher, Francois, et al., "A High-Performance Autozeroed CMOS Opamp with 50uV Offset", *IEEE International Solid-State Circuits Conference*, Session 21, Amplifiers, Paper SA 21.3, (1997), pp. 350-351.

Van De Plassche, R J., "Analog-To-Digital and Digital-To-Analog Converters", Springer, (1994), pp. 280-283.

"Partial European Search Report Dated Jul. 7, 2010", European Patent Application No. 10153869.2.

Gustat, Hans, "A DC-10 GHz amplifier with digital offset correction", *Materials Science in Semiconductor Processing, Proceedings of the Second International SIGE Technology and Device Meeting (ISTDM 2004)*, vol. 8, (Oct. 13, 2004), pp. 439-443.

Pastre, Marc, et al., *Methodology for the Digital Calibration of Analog Circuits and Systems, with Case Studies*, Published by Springer, (2006), pp. 12-14, 23-35, 52-62, 106-107.

Pastre, Marc, et al., "Methodology for the Digital Calibration of Analog Circuits and Systems Using Sub-binary Radix DACs", *Mixed Design of Integrated Circuits and Systems, MIXDES 2009, 16th International Conference*, (Jun. 25-27, 2009), pp. 456-461.

* cited by examiner

AMPLIFIERS WITH INPUT OFFSET TRIM AND METHODS

BACKGROUND OF THE INVENTION

1. Field of the Invention

The present invention relates to the field of operational and instrumentation amplifiers.

2. Prior Art

One of the key performance specifications of an operational amplifier is its DC error or offset voltage. The offset voltage limits the ability of the amplifier to resolve small DC input voltages. The total offset voltage is usually specified assuming a single source of error at the input terminals. The value of this imaginary voltage source represents the input referred offset voltage of the amplifier. The significance of this parameter lies in the fact that the amplifier will not be able to resolve any DC voltages at its input that are smaller than the input referred offset voltage.

In monolithically integrated operational amplifiers, the input referred offset voltage (also called input offset, offset voltage or just offset for short) is mostly due to statistical mismatch between critical components in the circuit. Commonly, these critical components include the input stage transistors, but other devices may contribute significantly to the offset as well. Typical offset voltages due to component mismatch lay in the order of several millivolts.

A well-known technique to reduce the input referred offset voltage of an amplifier is by trimming each amplifier during manufacturing. At some stage in the production process—usually while electrically screening the parts for defects—the native offset of the part is measured, and corresponding modifications are made to the part to compensate for this offset. The modifications to the part need to be permanent, in order for the offset to remain compensated for over the life of the product.

Many techniques have been proposed and used in the past to make permanent changes to an IC in order to store the offset compensation voltage. Examples include trimming resistors with a laser, blowing links with a laser, shorting out zener diodes by a high reverse voltage, blowing metal fuses with a high current, modifying the resistivity of a poly-silicon resistor with a high current and storing digital bits onto a non-volatile memory (e.g. flash).

Based on the timing of the trimming during the production process, all trimming techniques can be classified into one of two categories:

1. pre-package trim
2. post-package trim

As the name implies, pre-package trim includes all trim techniques that take place before the silicon die is packaged into its final package. Reversely, post-package trim is done after packaging the part.

The distinction between pre and post-package trim is a critical one, since the packaging process can lead to significant offset shifts of the part. Especially plastic packages, which include the majority of all parts being shipped today, can inflict high mechanical stresses to the silicon die. The piezoelectric properties of silicon convert the mechanical stresses into offset voltage shifts of the circuit. These offset shifts in their turn cause the input referred offset voltage of the part to change randomly after packaging. Typical offset shifts due to packaging are on the order of several 100s of microvolts.

A part that was trimmed for zero offset before packaging (pre-package trim), will most likely show a non-zero offset after being assembled. Therefore, pre-package trim is not able to guarantee very high accuracies of the trimmed offset voltage.

Post-package trim, on the other hand, takes into account offset shift due to packaging and will compensate for it. Very high trim accuracies can be achieved this way.

Despite its high end-accuracy, there are two main disadvantages associated with post-package trim. The first disadvantage of post-package trim is the need for some sort of on-die non-volatile memory. Most process technologies used for fabricating operational amplifiers do not offer non-volatile memory, and if they do, bit cells tend to be not very area-efficient.

The second disadvantage is the need to offer means to externally control the trim state and store the offset compensation value. In many cases this will require the addition of pins to the package, and increase cost. Alternatively, the part can employ some sophisticated multiplex approach to reuse the existing pins for controlling the offset trim algorithm. Such setup requires complex circuitry, however, adding to the die size and cost.

An approach to post-package trim that does not require non-volatile memory and external control of the trim algorithm is so-called power-on calibration. Using this technique, the part is not trimmed during manufacturing, but instead each time the part is powered up (see "Circuit Techniques for Reducing the Effects of Op-Amp Imperfections: Autozeroing, Correlated Double Sampling, and Chopper Stabilization", C. C. Enz and G. C. Temes, *IEEE J. Solid-State Circuits*, vol. 84, November 1996, pp. 1584-1614 and "A high-performance autozeroed CMOS opamp with 50 µV offset", Krummenacher et al., Solid-State Circuits Conference, 1997, Digest of Technical Papers, pp. 350-351, 483). Since the stored offset compensation value needs to be retained only while the supply power is available, power-on calibration alleviates the need for non-volatile memory. Instead, volatile memory can be used. This type of memory offers small die size, and it is ubiquitously available in any CMOS process technology in the form of flip-flops.

FIG. 1 shows the block diagram of an amplifier with power-on calibration.

It uses the successive approximation algorithm to cancel out the random input referred offset voltage $V_{os}$. Offset calibration of amplifier A is achieved through switch S, comparator COMP, the successive approximation state-machine SAR and finally the digital-to-analog converter D/A that feeds an offset correction voltage to amplifier A. When the amplifier is powered on, switch S is closed. This forces a differential input voltage that is equal to the input referred offset voltage $V_{os}$ at the input of amplifier A. Since there is no feedback, the amplifier A operates in the comparator mode: if the differential input voltage is greater than zero, its output will jump to the positive rail, and vice verse (assuming the offset correction voltage at port N is zero).

FIG. 2 shows a simplified representation of the amplifier circuit in FIG. 1 during calibration.

While calibrating, the input switch in FIG. 1 connects the offset source $V_{os}$ between the two differential inputs of amplifier A. This is represented by the offset source $V_{os}$ in FIG. 2. Since the D/A output voltage $V_{da}$ drives offset compensation port N on amplifier $A_1$ in FIG. 1, the effect of $V_{da}$ can be thought of as being subtracted from the offset voltage $V_{os}$ at the input of the amplifier. This is indicated in FIG. 2 by the plus sign for the voltage $V_{os}$, and the minus sign for the voltage $V_{da}$. The difference between offset voltage $V_{os}$ and correction voltage $V_{da}$ is error voltage ϵ. The sign of the error voltage ε, through amplifier A and comparator COMP, drives the decisions of the successive approximation algorithm.

After power-up the circuit will start its successive approximation state-machine to find a value for the offset correction voltage $V_{da}$ at the secondary input N that minimizes the input referred offset voltage of the overall circuit. The successive approximation operates as follows (see Analog-To-Digital and Digital-To-Analog Converters, R. J. van de Plassche, Springer, 1994). The circuit starts off with all bits to the digital-to-analog converter D/A set to zero. This causes the most negative voltage $V_{da}$ to be set on the offset compensation input N. If the offset compensation range is large enough, this negative voltage will always cause the output of amplifier A to trip high (E>0). In the next cycle, the most significant bit (MSB or $b_n$) of D/A will be tested high. If this causes the output of A to go low (ε<0), the bit will be returned to its low state before proceeding to the next bit. Otherwise, if the output of A does not change due to setting the MSB (ε>0), the bit will remain high. The state of the MSB will be stored into a register and does not change during the remainder of the calibration process. In the following step, the bit below the MSB ($b_{n-1}$) will be tested high and the resulting bit value stored into the register. This process continues successively through all bits, high to low, until the least significant bit is tested and its value stored.

Table 1 shows an example of the offset calibration procedure for a 3-bits SAR register in the simple case that the offset voltage $V_{os}$ is zero.

TABLE 1

Example of the successive approximation algorithm, assuming Vos = 0

| Step | $b_3$ (±1 V) | $b_2$ (±0.5 V) | $b_1$ (±0.25 V) | $V_{da}$ [V] | ε [V] ($V_{os} - V_{da}$) | Comment |
|---|---|---|---|---|---|---|
| 0 | 0 | 0 | 0 | −1.75 | +1.75 | Initial State |
| 1 | 1 | 0 | 0 | +0.25 | −0.25 | ε < 0, $b_2$ = 0 |
| 2 | 0 | 1 | 0 | −0.75 | +0.75 | ε > 0, $b_1$ = 1 |
| 3 | 0 | 1 | 1 | −0.25 | +0.25 | ε > 0, $b_0$ = 1 |
| 4 | 0 | 1 | 1 | −0.25 | +0.25 | Final State |

The table assumes that the MSB $b_3$ switches between the values −1V (bit low) and +1V (bit high). The other bits are binary weighted, such that $b_2$=±0.5V and $b_1$=±0.25V. Bits tested by the algorithm are underlined. The error value ε in the example of Table 1 approaches zero within the step size of one LSB (0.5V). The resulting binary code is (011) (see the bottom row).

Table 2 gives a similar example of the successive approximation algorithm, now assuming that the input offset voltage Vos is 1.6V. In this case the bits converge to the code (110), with a remaining error ε of 0.35V, which is again within one LSB step size.

TABLE 2

Example of the successive approximation algorithm, assuming Vos = 1.6

| Step | $b_3$ (±1 V) | $b_2$ (±0.5 V) | $b_1$ (±0.25 V) | $V_{da}$ [V] | ε [V] ($V_{os} - V_{da}$) | Comment |
|---|---|---|---|---|---|---|
| 0 | 0 | 0 | 0 | −1.75 | +3.35 | Initial State |
| 1 | 1 | 0 | 0 | +0.25 | +1.35 | ε > 0, $b_2$ = 1 |
| 2 | 1 | 1 | 0 | +1.25 | +0.35 | ε > 0, $b_1$ = 1 |
| 3 | 1 | 1 | 1 | +1.75 | −0.15 | ε < 0, $b_0$ = 0 |
| 4 | 1 | 1 | 0 | +1.25 | +0.35 | Final State |

Notice how in the examples in Table 1 and Table 2 the remaining output error ε is always greater than zero. This is a property of the successive approximation algorithm: if a particular bit is tested high and the error voltage ε becomes smaller than zero, the bit is reset to zero. As a result, the algorithm does not allow the error ε to become negative.

In fact, the distribution of the error ε is between zero and one LSB step size $S_{lsb}$. Ideally, we would like to see the error centered around zero. Doing so will half the maximum error ε from +1 $S_{lsb}$ to ±½ $S_{lsb}$. In order to perform the re-centering, we will need to add a value equal to ½ $S_{lsb}$ to the D/A converter voltage $V_{da}$ after the calibration completes. The shift of the final D/A converter voltage $V_{da}$ can be achieved by adding one more bit to the D/A converter, below the least significant bit $b_1$ (LSB). This additional bit is held at zero during the calibration process, and subsequently set to one, once the calibration is done. Table 3 illustrates the addition of a shift bit to the algorithm.

TABLE 3

Example of the successive approximation algorithm with a shift bit, assuming Vos = 1.6

| Step | $b_3$ (±1 V) | $b_2$ (±0.5 V) | $b_1$ (±0.25 V) | $b_s$ (±0.125 V) | $V_{da}$ [V] | ε [V] ($V_{os} - V_{da}$) | Comment |
|---|---|---|---|---|---|---|---|
| 0 | 0 | 0 | 0 | 0 | −1.875 | +3.475 | Initial State |
| 1 | 1 | 0 | 0 | 0 | +0.125 | +1.475 | ε > 0, $b_2$ = 1 |
| 2 | 1 | 1 | 0 | 0 | +1.125 | +0.475 | ε > 0, $b_1$ = 1 |
| 3 | 1 | 1 | 1 | 0 | +1.625 | −0.025 | ε < 0, $b_0$ = 0 |
| 4 | 1 | 1 | 0 | 1 | +1.375 | +0.225 | Final State |

In this example, the error ε in the final state is 0.225V (bottom row), which is less than half an LSB step size (0.25V).

Even though the successive approximation algorithm is very powerful in calibrating out the offset of an amplifier at power-up, it suffers from a major drawback. In order for the algorithm to be able to guarantee a certain end-accuracy of the calibration, matching of the various components in the D/A converter needs to be extremely tight. Especially matching of the MSB step size $S_{msb}$ to the other bits turns out to be critical. The matching error of the MSB step size $S_{msb}$ must be significantly less than one LSB step size $S_{lsb}$, in order for the mismatch not to affect the overall accuracy appreciably:

$$\Delta S_{msb} \ll S_{lsb} \qquad (1)$$

This can be rewritten as $$\frac{\Delta S_{msb}}{S_{msb}} \ll \frac{S_{lsb}}{S_{msb}} = \frac{1}{2^{n-1}} \qquad (2)$$

where n equals the number of bits of the D/A converter.

Accepting a maximum error due to mismatch of the MSB equal to half an LSB step size ½ $S_{lsb}$, the expression for the maximum matching error of the MSB simplifies to $$\frac{\Delta S_{msb}}{S_{msb}} \leq 2^{-n} \qquad (3)$$

Similar constraints as for the MSB on the maximum matching error occur for the other bits of the A/D converter, albeit with progressively looser matching requirements. The step size of the bits becomes smaller by a factor two for each step when going from the MSB to the LSB. Therefore the expression for the maximum matching error of individual bits becomes $$\frac{\Delta S_b}{S_b} \leq 2^{-b} \qquad (4)$$

where b equals the bit number (b=n for the MSB, b=1 for the LSB).

Clearly, matching of the MSB will be the most critical.

To illustrate the effect of mismatch on the transfer function of the D/A converter, FIG. 3 shows an example of the output voltage vs. input code of a 3-bit converter without any mismatch error.

The output steps through all eight possible output values with even step sizes as the input code progresses from (000) through (111). The ideal D/A converter of FIG. 3 can generate any voltage needed to compensate for the offset of the overall amplifier within half an LSB step size (½ $S_{lsb}$).

FIG. 4 shows the transfer function of the same D/A converter, now assuming a mismatch error that causes the MSB step size to be too large.

Note how the output voltage jumps when the input code goes from (011) to (100). This is because during this transition, the MSB is switched on. Turning on the MSB is supposed to almost make up for all other bits switching off, leaving a positive difference of 1 LSB step size $S_{lsb}$ between the output levels for codes (011) and (100). Since in this example the MSB step size $S_{msb}$ is too large, the MSB overcompensates for the other bits switching off, causing the difference between the two levels to be too large. This creates a gap between the output voltage levels for input codes (011) and (100).

The hatched area is a range of output voltages that is not covered by the D/A converter. If the voltage $V_{da}$ that is needed to compensate for the offset of the overall amplifier falls somewhere in the middle of the hatched voltage range, the offset voltage most likely cannot be corrected for within half an LSB step size, or ½ $S_{lsb}$.

When matching errors cause the MSB step size $S_{msb}$ to be too small, we obtain a D/A response similar to FIG. 5. The transfer function is not monotonic anymore and has a slightly reduced dynamic range compared to the ideal case of FIG. 3.

Despite these two factors, all output voltages within the dynamic range of the converter can now be produced within half an LSB step size (½ $S_{lsb}$). In other words, despite the MSB mismatch error, we can continue to guarantee that any offset voltage of the overall amplifier can be compensated for within ½ $S_{lsb}$. Note that monotonicity of the D/A transfer function is not required for the successive approximation algorithm to function properly.

Summarizing the effects of MSB mismatch on the successive approximation algorithm, we find the following:

1. A mismatch error that causes the MSB to be too large will deteriorate the worst-case offset voltage of the overall amplifier after calibration.
2. A mismatch error that causes the MSB to be too small does not significantly affect the overall accuracy of the offset calibration.

FIG. 6 illustrates this conclusion.

On the x-axis, it shows the ratio between the value of the MSB $b_n$ and the next bit $b_{n-1}$ (bit ratio ρ), while the y-axis represents the probability of a certain bit ratio ρ. Ideally, the bit ratio ρ is 2 (MSB $b_n$ twice as large as the next bit $b_{n-1}$). Due to mismatch between the components used to manufacture the circuit, the actual bit ratio ρ will vary around the mean value of 2 with a normal distribution having standard deviation $\sigma_p$. In order to make sure that the overall error due to component mismatches does not exceed half an LSB step size (½ $S_{lsb}$), the bit ratio ρ should not be too large.

The relation between the error Δρ of the bit ratio ρ and the mismatch $\Delta S_n/S_n$ of the MSB step size can be found as follows $$S_n = 2 \cdot S_{n-1} \qquad (5)$$
$$S_n + \Delta S_n = (2 + \Delta\rho) \cdot S_{n-1} \Rightarrow$$
$$\frac{\Delta S_n}{S_n} = \frac{\Delta\rho \cdot S_{n-1}}{S_n} = \frac{\Delta\rho}{2}$$

Using Eq. 3 and Eq. 5, we can now find for the maximum allowed error $\Delta\rho_{max}$ $$\Delta\rho_{max} = 2 \cdot 2^{-n} \qquad (6)$$

From Eq. 6 we can find the expression for the maximum acceptable absolute value of the bit ratio $\rho_{max}$ $$\rho_{max} = \overline{\rho} + \Delta\rho_{max} = 2 + 2^{1-n} \qquad (7)$$

where $\overline{\rho}$ is the mean or targeted bit ratio

The hatched area in FIG. 6 indicates the forbidden range of bit ratios ρ. Values of the bit ratio ρ that lie above $2+2^{1-n}$, indicated by the dashed line, lead to the calibration of the overall circuit potentially being out of spec (point 1 above), whereas any value of the bit ratio ρ below this limit guarantees a calibrated offset within the specifications (see point 2 above).

Based on Eq. 7, we can determine the maximum matching error of the bit ratio $$\frac{\Delta\rho_{max}}{\overline{\rho}} = 2^{-n} \qquad (8)$$

Note how the maximum acceptable matching error $\Delta\rho_{max}/\overline{\rho}$ goes down exponentially with the number of bits. Especially with high bit counts, this can result in very tight matching requirements.

Considering n=10 bits as an example, the maximum allowable mismatch error of the bit ratio $\Delta\rho_{max}/\overline{\rho}$ equals $2^{-10}$, or about 0.1% (Eq. 8). Requiring this to be a 6σ limit (probability of exceeding the spec limit smaller than ~1 ppb, assuming a normal distribution), means the standard deviation of the MSB bit ratio matching $\sigma_\rho$ must be smaller than 0.016%.

The matching requirements that follow from Eq. 8 are often very hard—if not impossible—to achieve in practical monolithically integrated circuits. Therefore, current state-of the art amplifiers with power-on calibration rely heavily on production screening of all possible D/A output levels to guarantee that the input referred offset will be within specs across wide ranges of operating conditions. Due to the large number of possible output levels (1024 for n=10), this production screening is both time-consuming and costly.

DETAILED DESCRIPTION OF THE PREFERRED EMBODIMENTS

Traditional successive approximation approaches to power-on calibration lead to excessively tight matching specifications of the D/A converter components. The present invention proposes a method to relax the matching requirements. Allowing for more variation will greatly improve the manufacturability of power-on calibration circuits.

Figure 6:
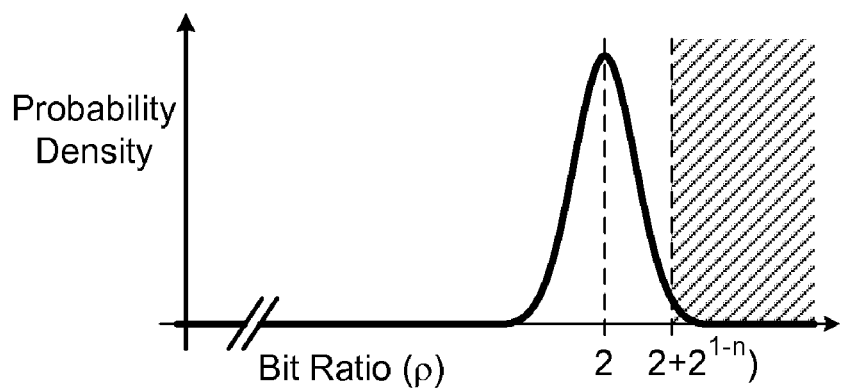
FIG. 6 shows the probability-density function of the bit ratio ρ of a SA D/A converter.

The key to improving the robustness of the power-on calibration lays in the use of a targeted bit ratio $\bar{\rho}$ that is smaller than the traditional $\bar{\rho}=2$. Note from FIG. 6 and Eq. 7 that any ratio ρ below $2+2^{1-n}$ (with a practical under limit of ρ=1) guarantees the accuracy of the calibration. By choosing a target bit ratio $\bar{\rho}$ less than 2, meeting the limit set by Eq. 7 becomes progressively easier.

Figure 7:
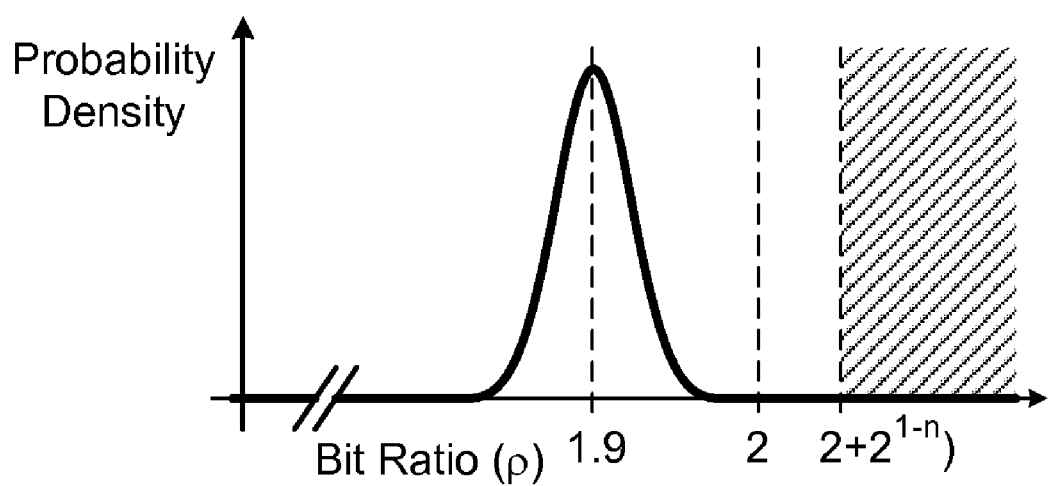
FIG. 7 shows the probability-density function of the bit ratio ρ for the proposed calibration circuit.

This is illustrated by FIG. 7.

This plot again shows the probability density function of the bit ratio ρ between the MSB $b_n$ and the adjacent bit $b_{n-1}$, assuming a normal distribution. The maximally allowable ratio ρ that guarantees proper calibration of the amplifier's offset is indicated by the dashed line at $\rho_{max}=2+2^{1-n}$. The hatched area indicates "forbidden" values for the ratio ρ. The main difference between the prior-art plot in FIG. 6 and the plot of FIG. 7 is that the bit ratio is now centered around a value that is slightly smaller than the traditional value of 2. FIG. 7 uses a mean bit ratio of $\bar{\rho}=1.9$ as an example.

A consequence of choosing a smaller mean bit ratio is that the peak of the probability density function moves away from the upper limit. A greater distance between the peak and the upper limit suggests it will be easier to meet the spec in production. This can be quantified as follows. The difference between the mean of the bit ratio $\bar{\rho}$ and the spec limit $\rho_{max}$ is given by $$\rho_{max}-\bar{\rho}=2+2^{1-n}-\bar{\rho} \qquad (9)$$

Since the number of bits n>>1 in most practical cases, this reduces to $$\rho_{max}-\bar{\rho}\approx 2-\bar{\rho} \qquad (10)$$

The matching requirement for the bit ratio ρ now becomes $$\frac{\Delta\rho_{max}}{\bar{\rho}} \approx \frac{2-\bar{\rho}}{\bar{\rho}} \approx \frac{2-\bar{\rho}}{2} \qquad (11)$$

The right hand side of Eq. 11 assumes the target bit ratio $\bar{\rho}$. is close to 2.

Note that the matching requirement that follows from Eq. 11 is independent of the total number of bits. In the prior-art case of $\bar{\rho}=2$ (binary weighted), the matching spec became exponentially tighter with a rising number of bits (Eq. 8).

By substituting our example of $\bar{\rho}=1.9$ into Eq. 11, we find the maximum allowable mismatch of the bit ratio as 5%. Again requiring a 6σ limit, this leads to a maximum standard deviation of the mismatch of the MSB bit ratio $\sigma_\rho$ equal to 0.8%. This is much looser than the 0.016% of the binary weighted prior art example. In fact, matching ratios on the order of 0.8% can routinely be realized in standard manufacturing processes without the need for additional trimming or production testing.

Figure 8:
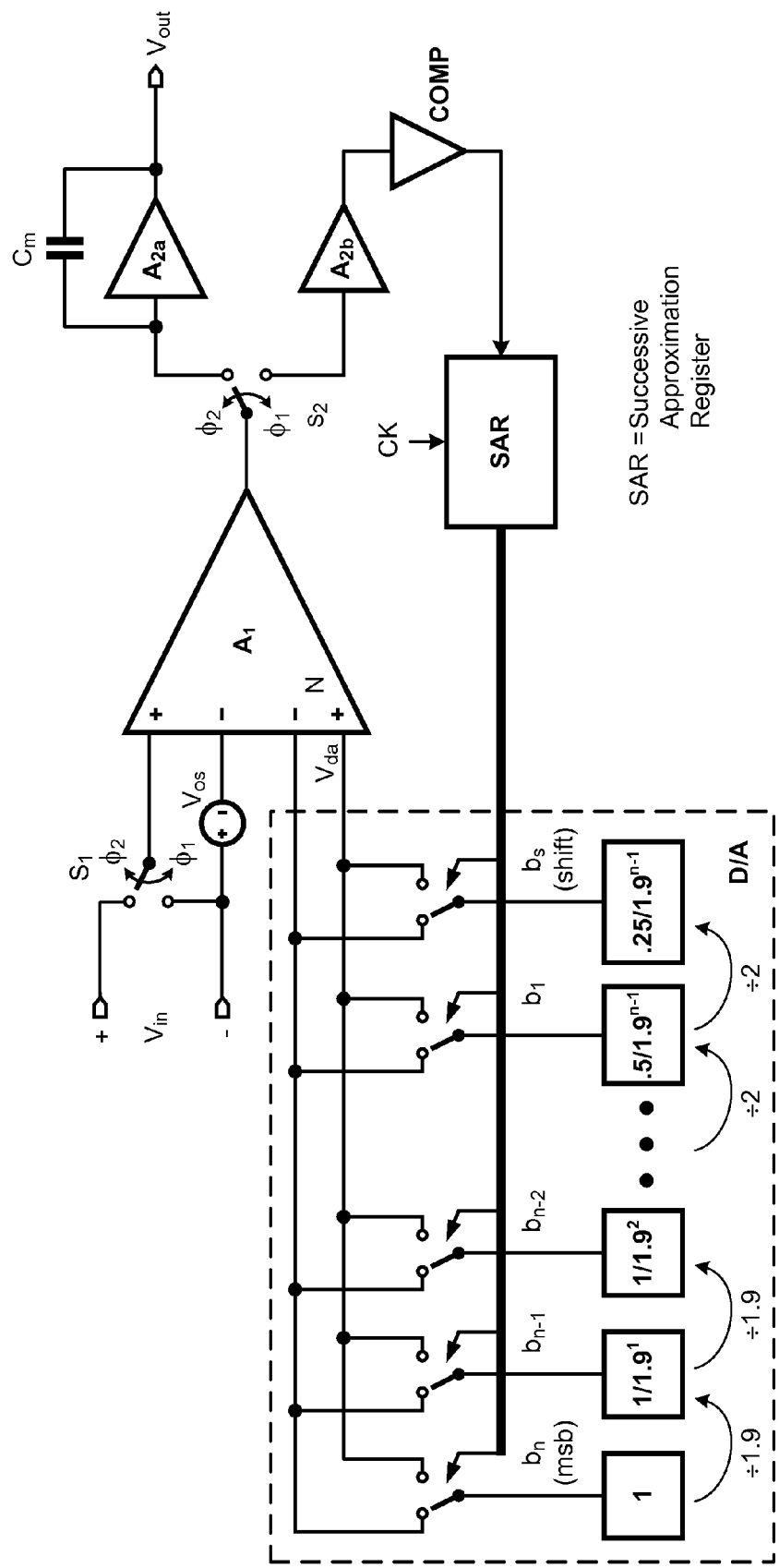
FIG. 8 shows a preferred embodiment of power-on calibration using a non-binary weighted D/A converter.

FIG. 8 shows the preferred embodiment of the proposed invention.

It consists of amplifier input stage $A_1$, and the two selectable output stages $A_{1a}$ and $A_{1b}$. Power-on offset calibration is performed through the comparator COMP, the successive approximation register SAR and a non-binary weighted D/A converter. The D/A converter comprises the switches $b_n$ through $b_s$, and the non-binary weighted bit values 1 through $1/1.9^{n-2}$, plus binary weighted values for the least significant bit controlled by switch $b_1$ and the shift bit $b_s$. At power up of the circuit, the input switch $S_1$ shorts out the inputs to the amplifier input stage $A_1$. As a result, the input referred offset voltage $V_{os}$ will be present between its differential input terminals. Output switch $S_2$ connects the input stage $A_1$ to the secondary output stage $A_{2b}$. Because of its connection to the secondary output stage $A_{2b}$, the comparator COMP can now drive the decisions of the successive approximation algorithm implemented by the register SAR. The least significant bit is given a binary weighting because of the fact that any error in that weighting does not cause an error that must be made up by subsequent bits, and the shift bit is given a binary weighting relative to the least significant bit as its purpose is to compensate for one half the least significant bit to cause the error ε to be centered around zero instead of always being on one side of zero, thereby cutting the maximum error in half.

Once the power-on offset calibration completes, switch $S_1$ connects the input terminals of the overall amplifier to the input stage $A_1$, while switch $S_2$ activates output stage $A_{2a}$. Also, the SAR register activates the shift bit $b_s$. Note that the ratio between the LSB $b_1$ and the shift bit $b_s$ remains two, even if all other bits are non-binary weighted. The amplifier is now in its normal mode of operation, with the register SAR holding a digital code that corresponds to a voltage $V_{da}$ that (mostly) compensates for the input referred offset $V_{os}$.

Even though the use of the two selectable output stages $A_{2a}$ and $A_{2b}$, along with output switch $S_2$ is not necessarily required for the invention to work properly, this setup has several key advantages over using a single output stage for both calibration and normal mode. First of all, selecting between the two output stages will prevent spurious signals or glitches to appear at the output terminal of the amplifier while the amplifier is being calibrated. A second benefit of duplicating the output stage is that the secondary output stage $A_{2b}$ can now be implemented without the addition of a compensation capacitor for closed loop stability. Frequency compensation capacitor $C_m$ is required during normal operation to ensure stability of the amplifier with overall feedback. Since the amplifier is operated in an open-loop comparator mode during power-on calibration, no frequency compensation is needed. Leaving out the compensation capacitor speeds up the decisions during the successive approximation procedure, reducing the total time spent in calibration mode.

As an alternative to a power-up event, the calibration sequence can also be initiated by any other trigger. In that case, the system performs on-demand-calibration as opposed to power-on calibration as described before.

Figure 9:
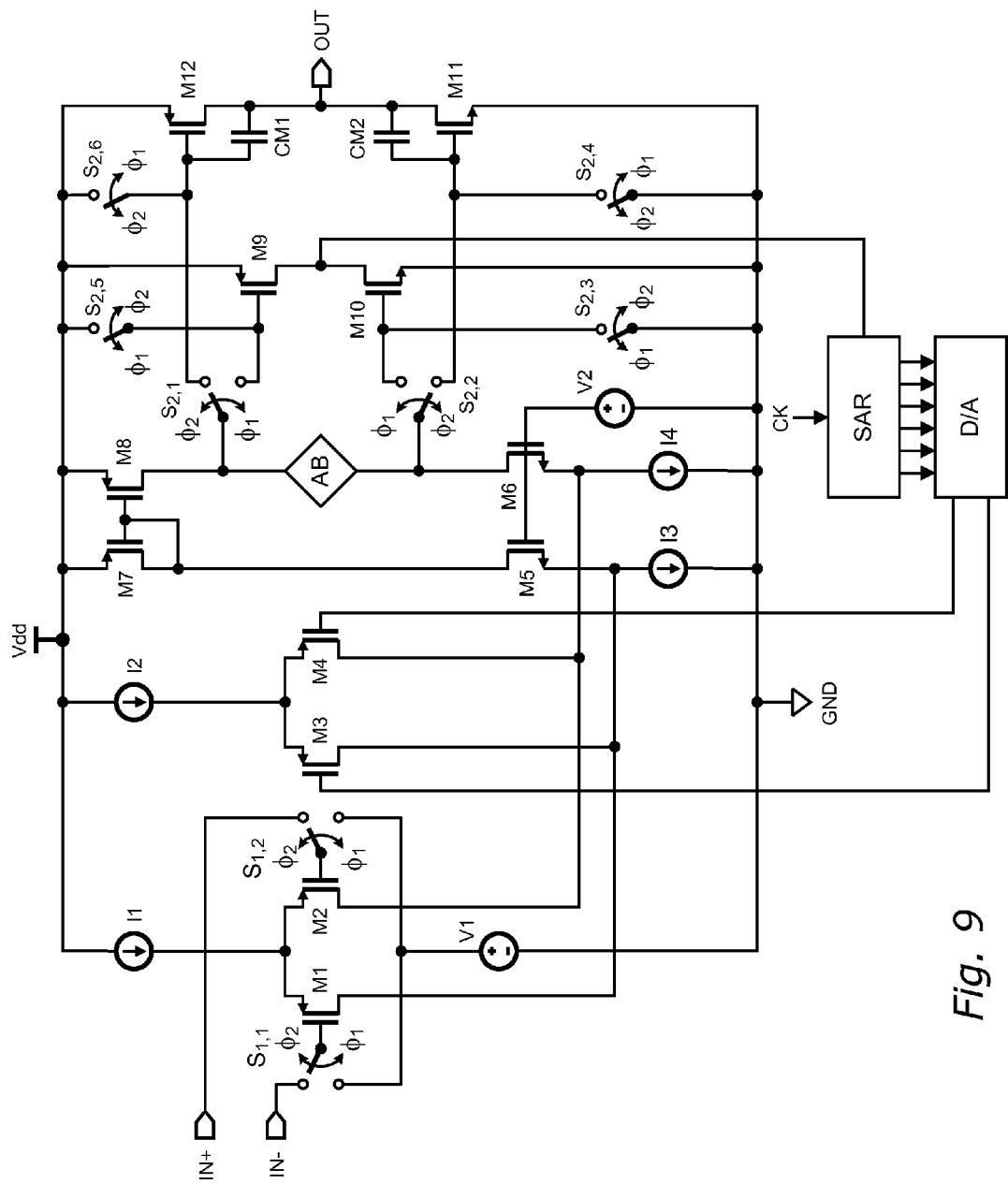
FIG. 9 is a simplified example of the circuit implementation of the proposed invention.

FIG. 9 shows a simplified example of a circuit implementation of the present invention.

It consists of the transconductance input stage with transistors $M_1$ and $M_2$. The gates of these devices are connected to switches $S_{1,1}$ and $S_{1,2}$. In normal mode, the switches directly connect the gates of $M_1$ and $M_2$ to the input terminals IN+ and IN−. During calibration, the inputs are shorted out and connected to the reference common-mode voltage $V_1$. Devices $M_5$ through $M_8$ implement a traditional folded cascode turnaround stage. The first or primary output stage used for normal operation comprises the devices $M_{11}$ and $M_{12}$, together with frequency compensation capacitors $C_{M1}$ and $C_{M2}$. The secondary output stage used during calibration includes devices $M_9$ and $M_{10}$. This secondary output stage does not require any frequency compensation components, since it will only be used in comparator mode. Switches $S_{2,1}$ and $S_{2,2}$ select between the two output stages. The block AB implements class-AB quiescent current control of the output stage devices (either $M_{11}$ and $M_{12}$, or $M_9$ and $M_{10}$, depending on the states of $S_{2,1}$ and $S_{2,2}$). When the primary output state M11 and M12 is selected, switches $S_{2,3}$ and $S_{2,5}$ are closed, putting the secondary output stage in a high output impedance state, and when the secondary output state M9 and M10 is selected, switches $S_{2,4}$ and $S_{2,6}$ are closed, putting the primary output stage in a high output impedance state.

The parallel input stage $M_3/M_4$ implements the offset control input. A differential voltage between the gates of $M_3$ and $M_4$ will cause a differential output current at their drains. This differential drain current flows in parallel to the drain current of the input stage $M_1/M_2$. A suitable differential voltage at the gates of $M_3$ and $M_4$ can compensate for a random offset of the input stage $M_1/M_2$. Since the range of offset voltages that the parallel input stage needs to compensate for is much smaller than the expected signal swing at the input of the amplifier, the tail current $I_2$ through devices $M_3$ and $M_4$ can be chosen smaller than the bias current of the input stage $I_1$.

The register SAR and the non-binary weighted D/A converter D/A implement the successive approximation algorithm as before.

Figure 10:
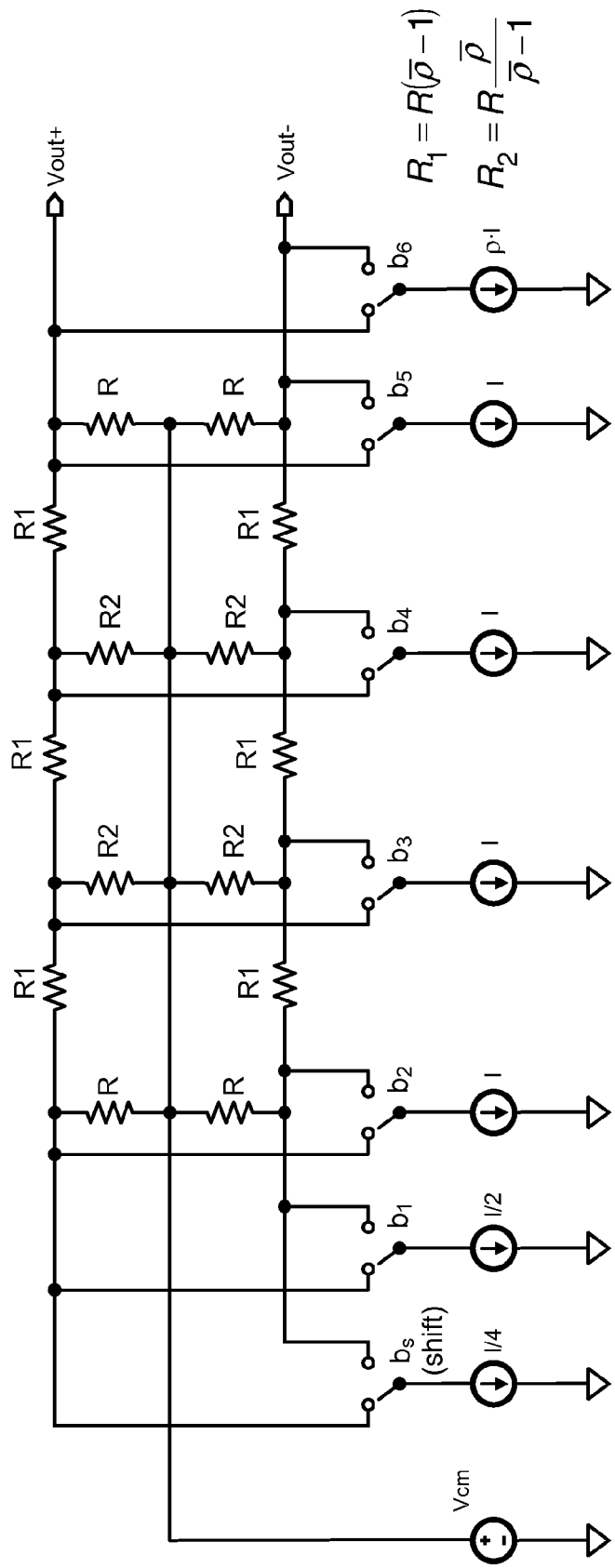
FIG. 10 shows an example of the circuit implementation of the non-binary weighted A/D converter.

FIG. 10 shows an example of a 6-bit implementation of the non-binary weighted D/A converter.

It consists of a three-section differential resistive ladder with resistor values R, $R_1$ and $R_2$. The common-mode voltage of the ladder is set by voltage source $V_{cm}$. Note that this voltage is not related to any common mode voltage of an input signal IN+,IN−, as the transistors M3 and M4 operate in a differential mode to control the division of the current I2 (FIG. 9), independent of the operation of the differential input stage transistors M1 and M2. The switches $b_s$ through $b_6$ steer the currents from the bottom current sources to either side of the differential ladder, depending on the states of the input bits. In this example, the weighting of the bits $b_2$ through $b_4$ is done through the resistive ladder, while weighting of $b_s$, $b_1$ and $b_6$ is implemented through scaling of the respective current sources. This choice is arbitrary, and not critical to the operation of the circuit.

Targeting a bit ratio of $\overline{\rho}$, the values of the resistors can be found as follows $$R_1 = R \cdot (\overline{\rho} - 1) \tag{12}$$

$$R_2 = R \cdot \frac{\overline{\rho}}{\overline{\rho} - 1}$$

where R is the characteristic impedance of the ladder.

Note how choosing a bit ratio $\overline{\rho}=2$ (standard binary weighing) transforms the D/A converter of FIG. 10 into a traditional R-2R ladder ($R_1$=R, $R_2$=2R).

By adding an additional input stage to the circuit of FIG. 9, it can easily be transformed into a so-called instrumentation amplifier (see Operational Amplifiers, Theory and Design, J. Huijsing, pp. 52-53, Boston, Kluwer Academic Publishers, 2001). Instrumentation amplifiers have two sets of differential input terminals and are capable of sensing small differential signals in the presence of a large common-mode disturbance.

In order for the power-on calibration to work properly in the modified circuit, only the input stage devices and the input switches need to be repeated from the original amplifier. The offset calibration can be performed across both input stages combined and therefore does not require any other additional components.

Figure 11:
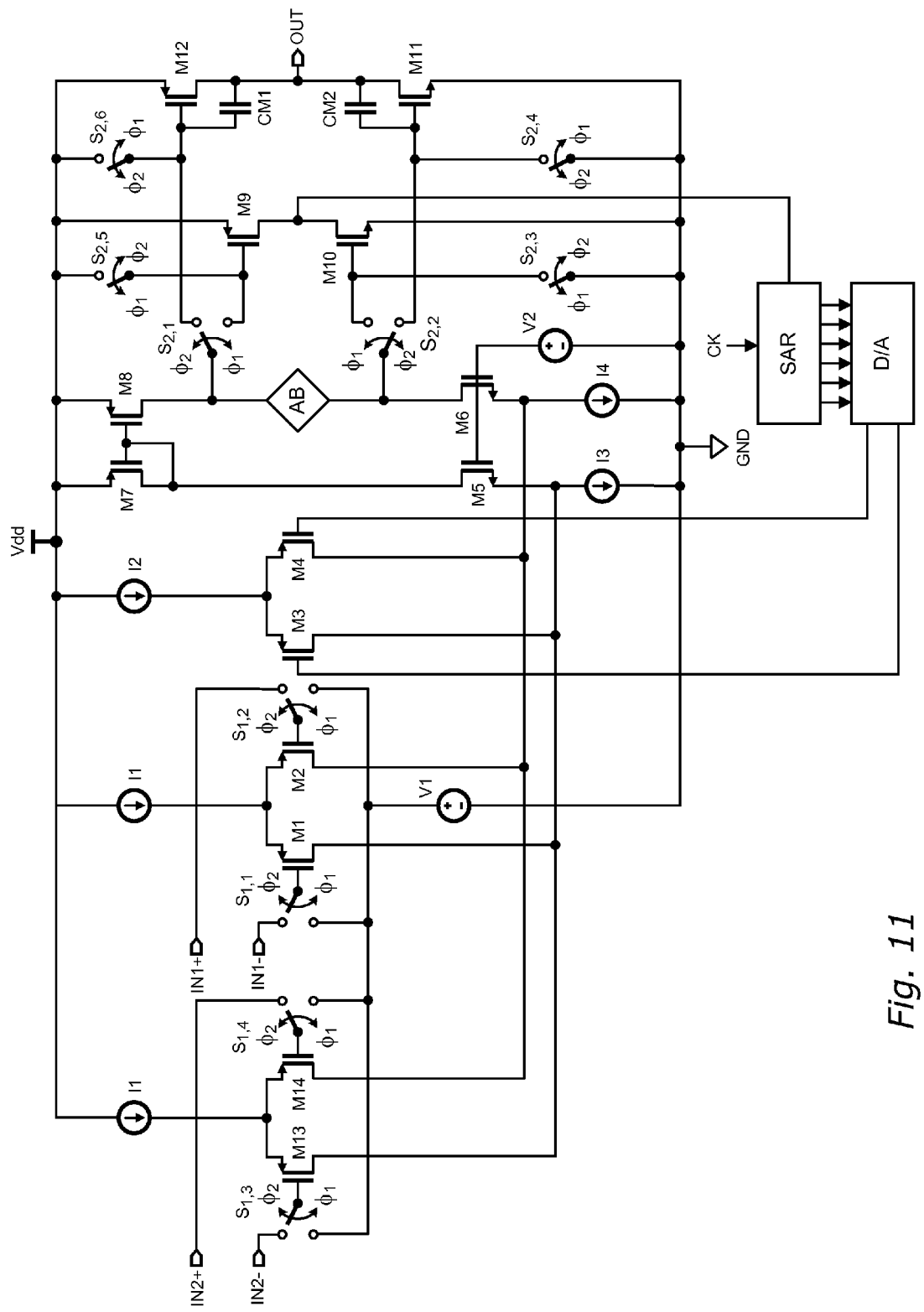
FIG. 11 shows an example of an instrumentation amplifier with power-on calibration.

FIG. 11 shows the instrumentation amplifier that results from modifying the circuit depicted in FIG. 9. The components added to the circuit are the two input stage with $M_{13}$ and AU, along with the corresponding input switches $S_{1,3}$ and $S_{1,4}$, which would be operated simultaneously with $S_{1,1}$ and $S_{1,2}$.

Figure 1:
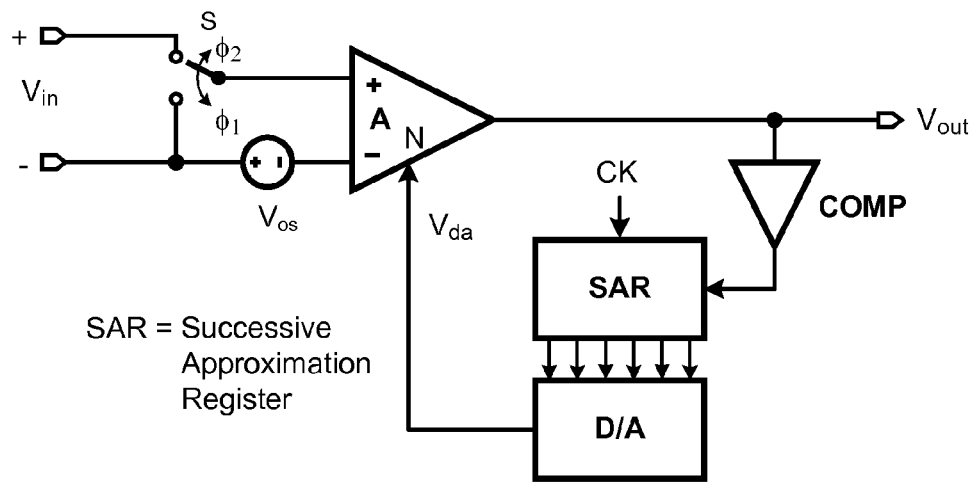
FIG. 1 shows a prior art amplifier with power-on calibration.
Figure 2:
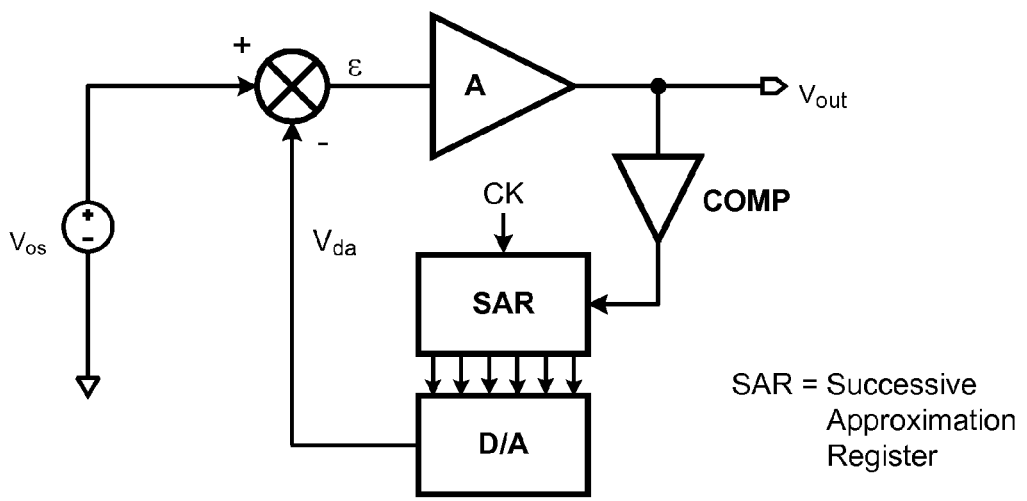
FIG. 2 shows a prior art power-on calibrated amplifier in calibration mode.
Figure 3:
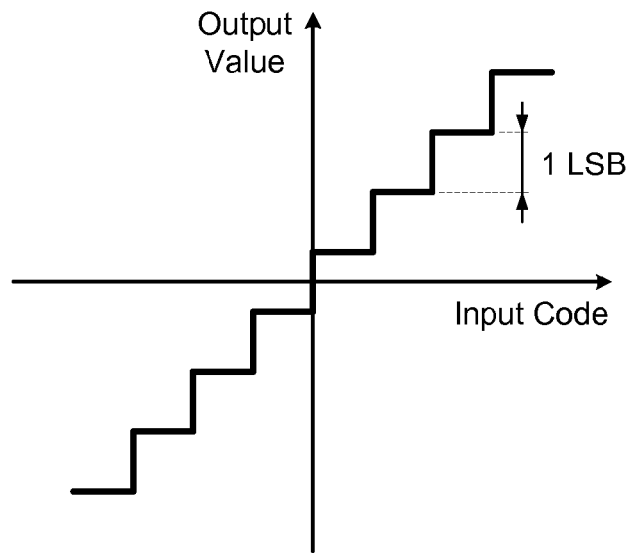
FIG. 3 shows an ideal 3-bit D/A transfer function.
Figure 4:
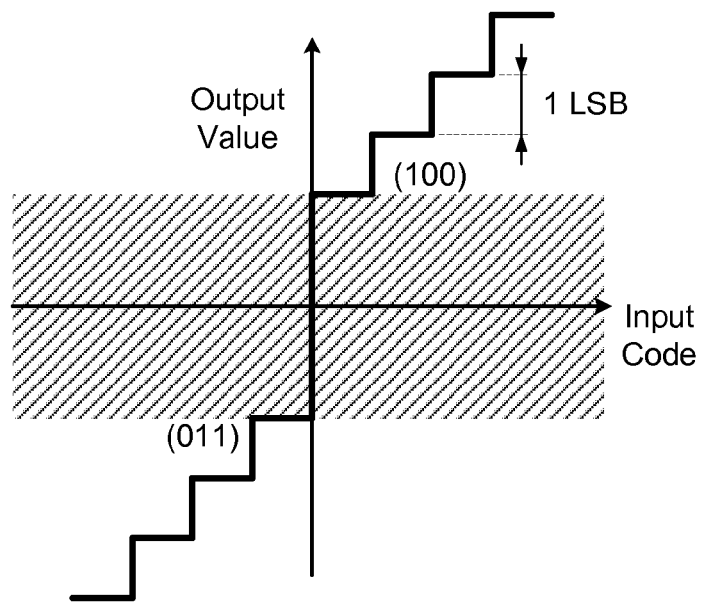
FIG. 4 shows a 3-bit D/A converter transfer curve: MSB too large.
Figure 5:
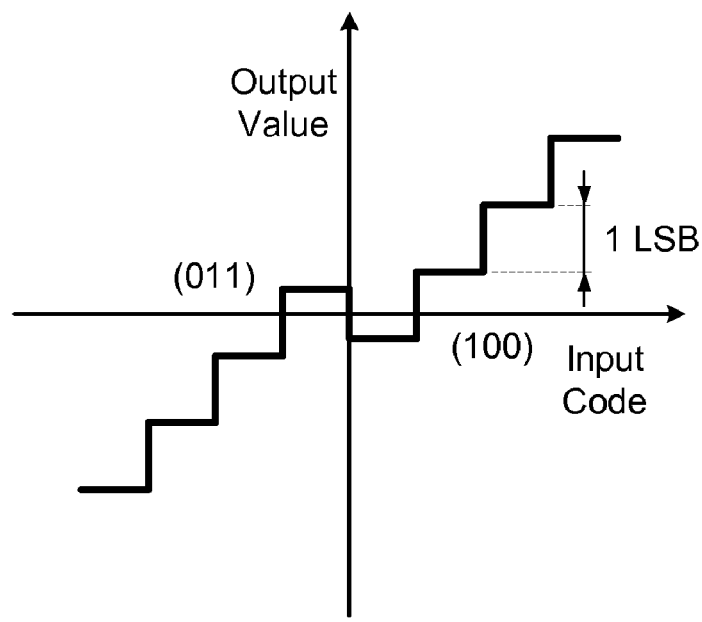
FIG. 5 shows a 3-bit D/A converter transfer curve: MSB too small.

The embodiments shown herein in FIGS. 9 and 11 are MOS embodiments, though other active devices may be used, such as bipolar devices. Also the word switch as used herein and in the claims is used in the general sense, and includes single or multiple switches, as appropriate. When the word switch is used in the context of multiple switches, such multiple switches would be operated substantially simultaneously, though perhaps with a preferred nonoverlapping phasing. By way of example, a switch for switching an input of the amplifier from the amplifier system input to shorting the amplifier input might be a single switch such as switch S in FIG. 1 or two switches $S_{1,1}$ and $S_{1,2}$ in FIG. 9, or, by way of another example, might be four switches, two for disconnecting the differential input stage from the differential amplifier input, and two to short the input to the differential input stage. In this latter case, one normally would prefer to disconnect the differential amplifier input before shorting the differential input stage, thereby defining a nonoverlapping operation.

Similarly, a reference to an input or an output herein and in the claims is a reference to an input or an output generally, independent of whether the input or output is a single signal relative to a circuit ground, or a differential signal.

Figure 12:
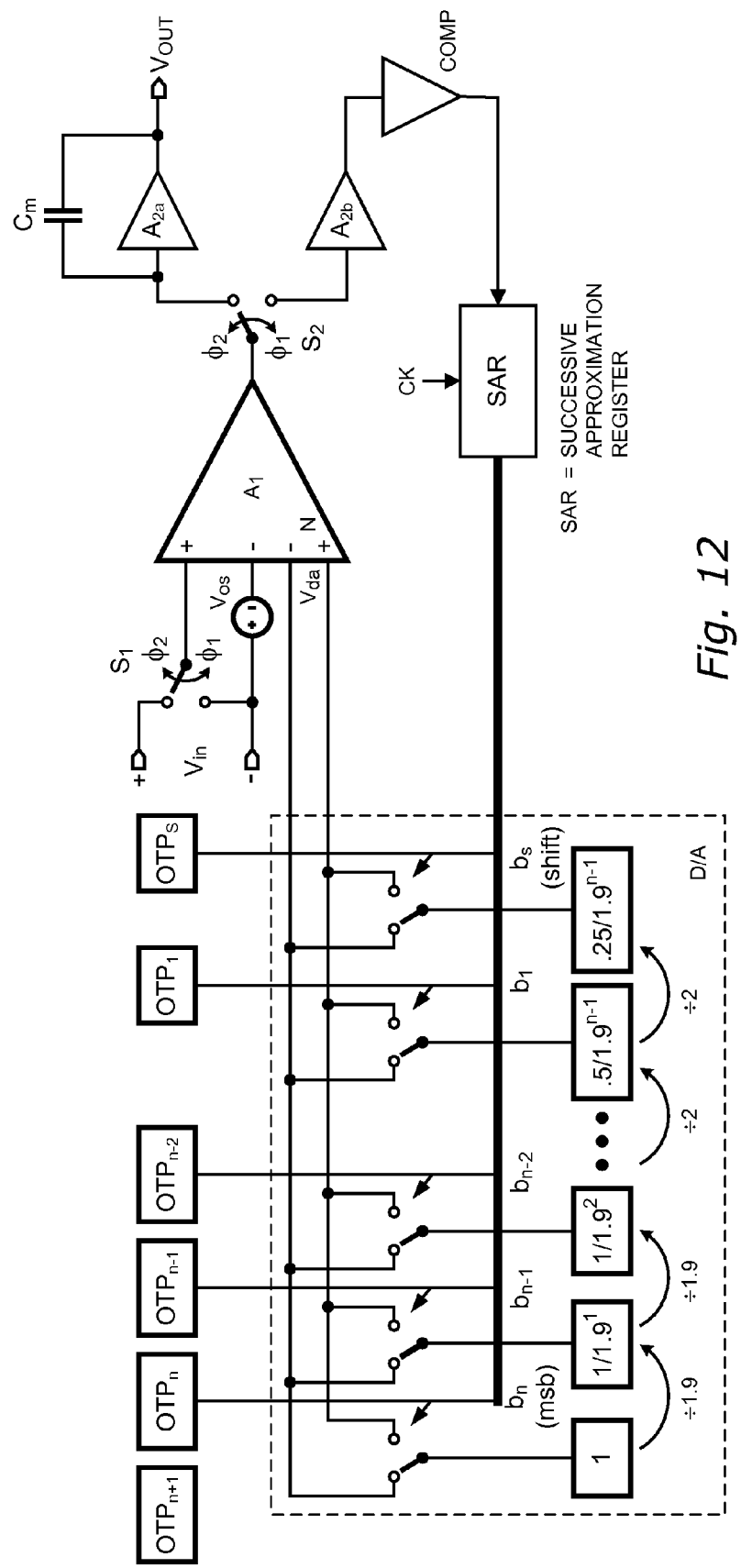
FIG. 12 presents an exemplary configuration to trim at production, while storing the results in one-time programmable memory.

The approach of FIG. 8 can be extended to perform one-time calibration during the fabrication of the device. In that case, the circuit requires some form of One-Time-Programmable memory, or OTP, to store the result of the calibration during the life-time of the product. FIG. 12 shows an example.

When the device is powered up for the first time, the circuit will go through its auto-calibration cycle. Once the cycle completes, the resulting values for the bits $b_n$ through $b_s$ will be stored onto the non-volatile memory OTP. On subsequent power-up events, the stored offset compensation bits will be read from the OTP memory, and used to control the bit switches $b_n$ through $b_s$. One additional OTP cell $OTP_{n+1}$ is needed to establish the fact that the part has been programmed. This will avoid future attempts at calibrating the offset when the part is powered up in its application.

During auto-calibration, the overall amplifier in FIG. 8 is non-responsive to external signals. This is caused by switches $S_1$ and $S_2$ that disconnect the amplifier from the external circuitry. Since the auto-calibration time can be short, disabling the amplifier will not cause issues in many, if not most, applications. In the situations where a controlled output voltage is needed, even during the auto-calibration sequence, the circuit of FIG. 13 brings a solution.

Figure 13:
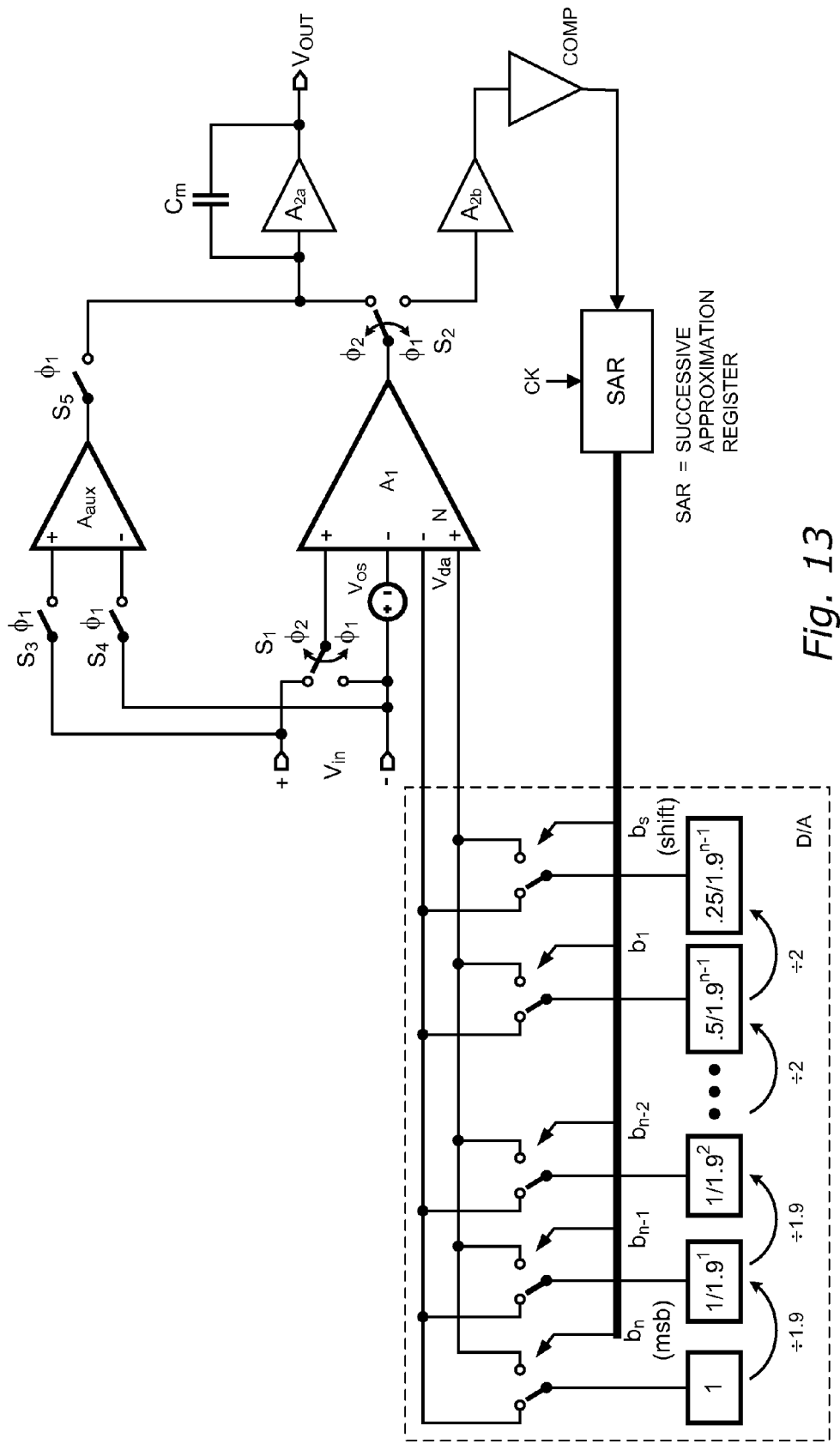
FIG. 13 shows the addition of an auxiliary amplifier to control the output during calibration.

The circuit of FIG. 13 adds an auxiliary amplifier $A_{aux}$ to the base circuit of FIG. 8, along with the switches $S_3$ through $S_5$. When the part is auto-calibrating, the switches $S_3$ through $S_5$ are closed, and the auxiliary amplifier $A_{aux}$ and the output stage $A_{2a}$ create a signal path from the input terminals $V_{in}$ to the output $V_{out}$. Since the calibration time is short, so the auxiliary amplifier will not have enough time to settle to a very high accuracy anyhow, offset and other demands on the auxiliary amplifier can be relaxed compared to the main circuit. As a result, a very simple circuit suffices in most practical cases.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. An amplifier system having an amplifier system input and an amplifier system output comprising:
   a first amplifier;
   a comparator;
   a successive approximation register having an input coupled to an output of the comparator;
   a first switch for switching an input of the first amplifier from the amplifier system input to shorting the first amplifier input;
   a second switch for switching an output of the first amplifier from the amplifier system output to an input of the comparator;
   an output of the successive approximation register being coupled to an N bit digital to analog (D/A) converter;
   the D/A converter being a non-binary converter using a radix of less than 2 for at least the most significant bits;
   an output of the D/A converter being coupled to the first amplifier to control the input offset of the first amplifier.

2. The amplifier system of claim 1 wherein the radix is approximately 1.9.

3. The amplifier system of claim 2 wherein the radix for the least significant bit is 2.

4. The amplifier system of claim 1 wherein the D/A converter further comprises one additional bit providing an input offset control of the first amplifier of one half that of the least significant bit of the N bits.

5. The amplifier system of claim 1 wherein the first amplifier has a first transconductance differential input stage coupled to the first amplifier input, and wherein the first amplifier is further comprised a second transconductance differential input stage, the outputs of the first and second transconductance differential input stages being coupled in parallel, the output of the D/A converter being coupled to inputs of the second transconductance differential input stage to divide a current source coupled to the second transconductance differential input stage between the differential outputs of the first transconductance differential input stage in a proportion to reduce the input offset of the first amplifier.

6. The amplifier system of claim 5 wherein the first amplifier further comprises an intermediate stage having an input coupled to the parallel connected outputs of the first and second transconductance differential input stages, a first output stage providing the first amplifier output, a second output stage forming the comparator, the second switch for switching an output of the intermediate stage between inputs to the first and second output stages.

7. The amplifier system of claim 6 wherein the second switch also sets the first output stage to a high impedance state when the second switch couples the input of the second output stage to the output of the intermediate stage, and sets the second output stage to a high impedance state when the second switch couples the input of the first output stage to the output of the intermediate stage.

8. The amplifier system of claim 6 wherein the first amplifier is further comprised of a third transconductance differential input stage, the outputs of the first, second and third transconductance differential input stages being coupled in parallel, the first switch for shorting the first amplifier input by shorting the differential input to the first transconductance differential input stage and shorting the differential input to the third transconductance differential input stage at the same time.

9. The amplifier system of claim 1 further comprised of One-Time-Programmable memory for permanently storing an output of the successive approximation register, whereby a single output of the D/A converter controlling the input offset of the first amplifier may be permanently maintained.

10. The amplifier system of claim 1 further comprised of a second amplifier, the first switch coupling the amplifier system input to an input of the second amplifier when shorting the input to the first amplifier, the second switch coupling an output of the second amplifier to the amplifier system output when switching the output of the first amplifier from the amplifier system output to an input of the comparator.

11. The amplifier system of claim 1 wherein the D/A converter comprises a common reference line, and at least in part, resistor ladders symmetrical about the common reference line, and third switches for selectively switching equal current sources to ladder nodes on either side of the common reference line responsive to the successive approximation register, the resistor ladders being $R(\rho-1), R\rho/(\rho-1)$ ladders, where $\rho$ is less than 2.

12. The amplifier system of claim 11 wherein $\rho$ is approximately 1.9.

* * * * *